United States Patent
Chia et al.

(10) Patent No.: US 12,207,435 B2
(45) Date of Patent: Jan. 21, 2025

(54) COOLING FAN ASSEMBLY WITH AIR GUIDER

(71) Applicant: Cisco Technology, Inc., San Jose, CA (US)

(72) Inventors: Vic Hong Chia, Sunnyvale, CA (US); Yongguo Chen, Shanghai (CN); Yaotsan Tsai, San Jose, CA (US); Hua Yang, Tracy, CA (US); Xin Mao, Milpitas, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 319 days.

(21) Appl. No.: 17/826,520

(22) Filed: May 27, 2022

(65) Prior Publication Data

US 2023/0389224 A1 Nov. 30, 2023

(51) Int. Cl.
H05K 7/20 (2006.01)

(52) U.S. Cl.
CPC ..... *H05K 7/20172* (2013.01); *H05K 7/20145* (2013.01)

(58) Field of Classification Search
CPC ......... F04D 5/003–008; F04D 25/0613; F04D 25/08; F04D 29/023; F04D 29/2283; F04D 29/325; F04D 29/40; F04D 29/4246; F04D 29/4293; F04D 29/48; F04D 29/50; F04D 29/522; F04D 29/526; F04D 29/544; F04D 29/644; F04D 29/646; F04D 29/664; H05K 7/20136; H05K 7/20145; H05K 7/20163; H05K 7/20172; H05K 7/20718;
(Continued)

(56) References Cited

U.S. PATENT DOCUMENTS

| | | | |
|---|---|---|---|
| 4,657,483 A | 4/1987 | Bede | |
| 6,565,334 B1 * | 5/2003 | Bradbury | F04D 29/384 |
| | | | 417/244 |
| 2006/0177306 A1 | 8/2006 | Parker et al. | |

(Continued)

FOREIGN PATENT DOCUMENTS

| | | | | |
|---|---|---|---|---|
| CN | 110681511 A | * | 1/2020 | ............. B05B 12/18 |
| KR | 101184988 B1 | | 10/2012 | |
| KR | 20150005321 A | * | 1/2015 | |

OTHER PUBLICATIONS

CN-110681511-A English Translation (Year: 2020).*
(Continued)

*Primary Examiner* — Amir A Jalali
(74) *Attorney, Agent, or Firm* — Edell, Shapiro & Finnan, LLC

(57) ABSTRACT

A fan assembly comprises: a fan having a fan intake and a fan exit downstream from the fan intake, wherein the fan is configured to draw air into the fan intake and propel the air downstream through the fan exit; a housing having a housing inlet coupled to the fan exit and a housing outlet downstream from the housing inlet; and an air guider, mounted inside the housing adjacent to the housing inlet, having a conical shape with a base adjacent to the housing inlet and an apex opposite the base that points towards the housing outlet, wherein the air guider has a first diameter that tapers from the base to the apex, and wherein the air guider is configured to reduce air turbulence of the air when the air is propelled from the housing inlet to the housing outlet.

20 Claims, 8 Drawing Sheets

(58) Field of Classification Search
CPC .... H05K 9/0015; H05K 9/0041; G10K 11/16; G10K 11/161
See application file for complete search history.

(56) References Cited

U.S. PATENT DOCUMENTS

| | | | | |
|---|---|---|---|---|
| 2006/0237169 | A1* | 10/2006 | Franz | F28D 15/0266 257/E23.098 |
| 2007/0013242 | A1 | 1/2007 | Tung et al. | |
| 2007/0242431 | A1* | 10/2007 | Kuo | H01L 23/467 257/E23.099 |
| 2008/0239665 | A1* | 10/2008 | Franz | F04D 29/664 417/423.15 |
| 2018/0051429 | A1* | 2/2018 | Yamaoka | A01G 20/47 |
| 2018/0087513 | A1* | 3/2018 | Hoffman | F04D 19/002 |
| 2018/0195526 | A1* | 7/2018 | Hakozaki | F04D 29/34 |
| 2019/0024675 | A1 | 1/2019 | Chen et al. | |
| 2021/0078837 | A1* | 3/2021 | Sikora | F04D 27/004 |
| 2021/0107664 | A1* | 4/2021 | Rabbi | B64D 33/08 |
| 2021/0259167 | A1* | 8/2021 | Wang | F04D 29/542 |
| 2022/0201946 | A1* | 6/2022 | Cholst | F04D 29/545 |
| 2022/0312636 | A1* | 9/2022 | Chia | F04D 29/664 |

OTHER PUBLICATIONS

KR-20150005321-A English Translation (Year: 2015).*
Mark Hurtado, et al., "Axial Fan Design Using Multi-Element Airfoils to Minimize Noise," Madrid, Inter Noise, Jun. 16-19, 2019, 11 pages.
"Session 9—Counter Rotating Fan Features," Tech Compass Sanyo Denki, Training Fan Basics, retrieved from Internet May 25, 2022, 8 pages; https://techcompass.sanyodenki.com/en/training/cooling/fan_basic/009/index.html.
"Permanent Magnets," Chief Lion Enterprise Co., Ltd., retrieved from Internet May 25, 2022, 6 pages; http://www.chief-lion.com/style/frame/m3/product_detail.asp?lang=2&customer_id=2708&content_set=color_1&name_id=132187&Directory_ID=73278&id=396767.

* cited by examiner

COOLING FAN ASSEMBLY WITH AIR GUIDER

TECHNICAL FIELD

The present disclosure relates to fan assemblies for cooling systems.

BACKGROUND

A challenge facing the design of a fan in an air-cooling system is balancing power consumption efficiency, airflow performance, and acoustic noise generated by the fan. The higher the speed (e.g., revolutions per minute (RPM)) of the fan, the higher the noise generated, and the higher the power consumed. Current fan arrangements fail to achieve maximum cooling performance while reducing power and noise because optimal approaches for balancing these factors are not well understood. In addition, electronic systems have advanced rapidly due to the unprecedented growth of silicon application specific integrated circuits (ASICs). ASICs consume higher electrical power in smaller circuit packages, which equates to higher heat density. Current cooling solutions struggle to match the advanced cooling challenges presented by the ASICs. Some fan designs focus on fan blade optimization, motor efficiency, and so on; however, such solutions fail to achieve optimum fan efficiency.

DESCRIPTION OF EXAMPLE EMBODIMENTS

Overview

In an embodiment, a fan assembly comprises: a fan having a fan intake and a fan exit downstream from the fan intake, wherein the fan is configured to draw air into the fan intake and propel the air downstream through the fan exit; a housing having a housing inlet configured to be coupled to the fan exit and a housing outlet downstream from the housing inlet; and an air guider, mounted inside the housing adjacent to the housing inlet, having a conical shape with a base adjacent to the housing inlet and an apex opposite the base that points towards the housing outlet, wherein the air guider has a first diameter that tapers from the base to the apex, wherein the first diameter is less than a second diameter of the housing to define a surrounding the air guider that serves as a tunnel, wherein the air guider is configured to reduce air turbulence of the air when the air propelled from the housing inlet to the housing outlet.

EXAMPLE EMBODIMENTS

Embodiments presented herein provide a cooling fan assembly configured to establish an airflow pattern to achieve highly laminar airflow with reduced turbulence, which increases fan motor efficiency, and decreases air vibration and noise. The cooling fan assembly (referred to simply as the "fan assembly") reduces drag experienced by the airflow within the fan assembly, to achieve power savings. To achieve such improved performance, the fan assembly introduces an airflow guider (referred to simply as an "air guider") in the fan assembly between an air intake of a fan of the fan assembly and an air outlet of the fan assembly. The airflow guider has a conical shape that tapers or narrows (i.e., is tapered) in a downstream direction in which air flows through the fan assembly and over the airflow guider. The airflow guider reduces vortexes or air swirling in, and resistance to, the airflow over/around the airflow guider. Such streamlined airflow increases fan efficiency and quietens operation of the fan assembly, i.e., reduces the level of acoustic noise generated by the fan assembly.

Figure 1:
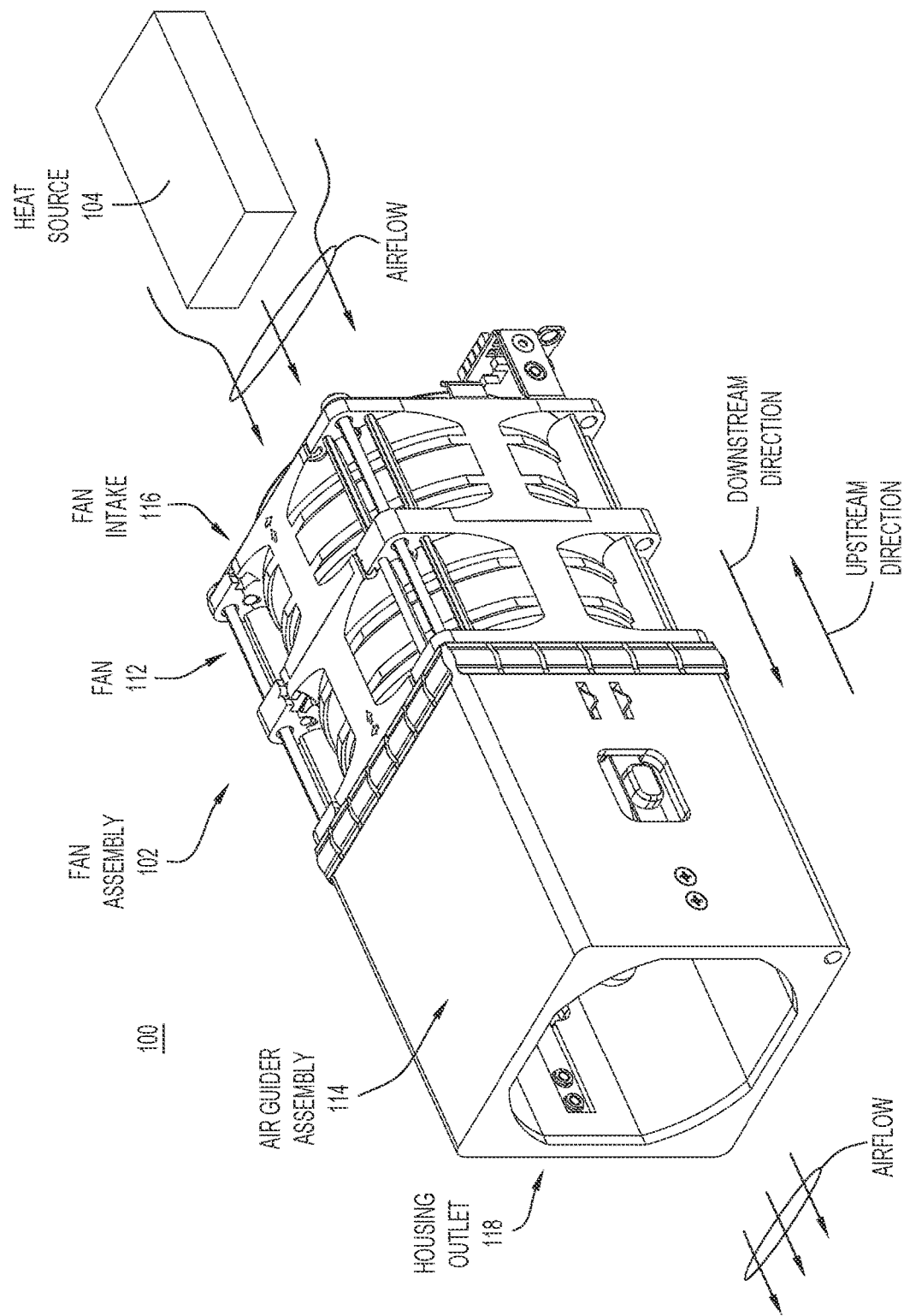
FIG. 1 is a high-level block diagram of a first fan cooling arrangement in which a fan assembly cools a heat source positioned upstream from the fan assembly, according to an example embodiment.

With reference to FIG. 1, there is a high-level block diagram of an example first fan cooling arrangement 100 in which a fan assembly ("ASSY") 102 configured according to embodiments presented herein cools a heat source 104 positioned upstream from the fan assembly. FIG. 1 presents a perspective view on an exterior of fan assembly 102. Fan assembly 102 includes a fan 112 mounted or fixed to an air guider assembly 114 downstream of the fan. That is, fan 112 is positioned upstream from air guider assembly 114. Fan 112 includes a fan intake 116 and air guider assembly 114 includes a housing outlet 118 spaced-apart from the fan intake in a downstream direction, i.e., the housing outlet is "downstream" from the fan intake. When operating, fan 112 draws air into fan intake 116 and an interior of fan assembly 102. Fan 112 propels or forces the air (i.e., establishes an airflow) in the downstream direction through fan assembly 102 from fan intake 116 to and through housing outlet 118. Thus, fan assembly 102 draws air into fan intake 116 and forces air out of, i.e., exhausts the air through, housing outlet 118.

In the example of FIG. 1, heat source 104, positioned adjacent to fan intake 116 in the upstream direction, may be an electronic assembly, such as an ASIC, for example, which generates a substantial amount of heat while operating. When operating, fan assembly 102 continuously draws heated air surrounding heat source 104 into the fan assembly and vents or exhausts the air through housing outlet 118. In this way, fan assembly 102 draws heat away from, and thereby cools, heat source 104.

Figure 2:
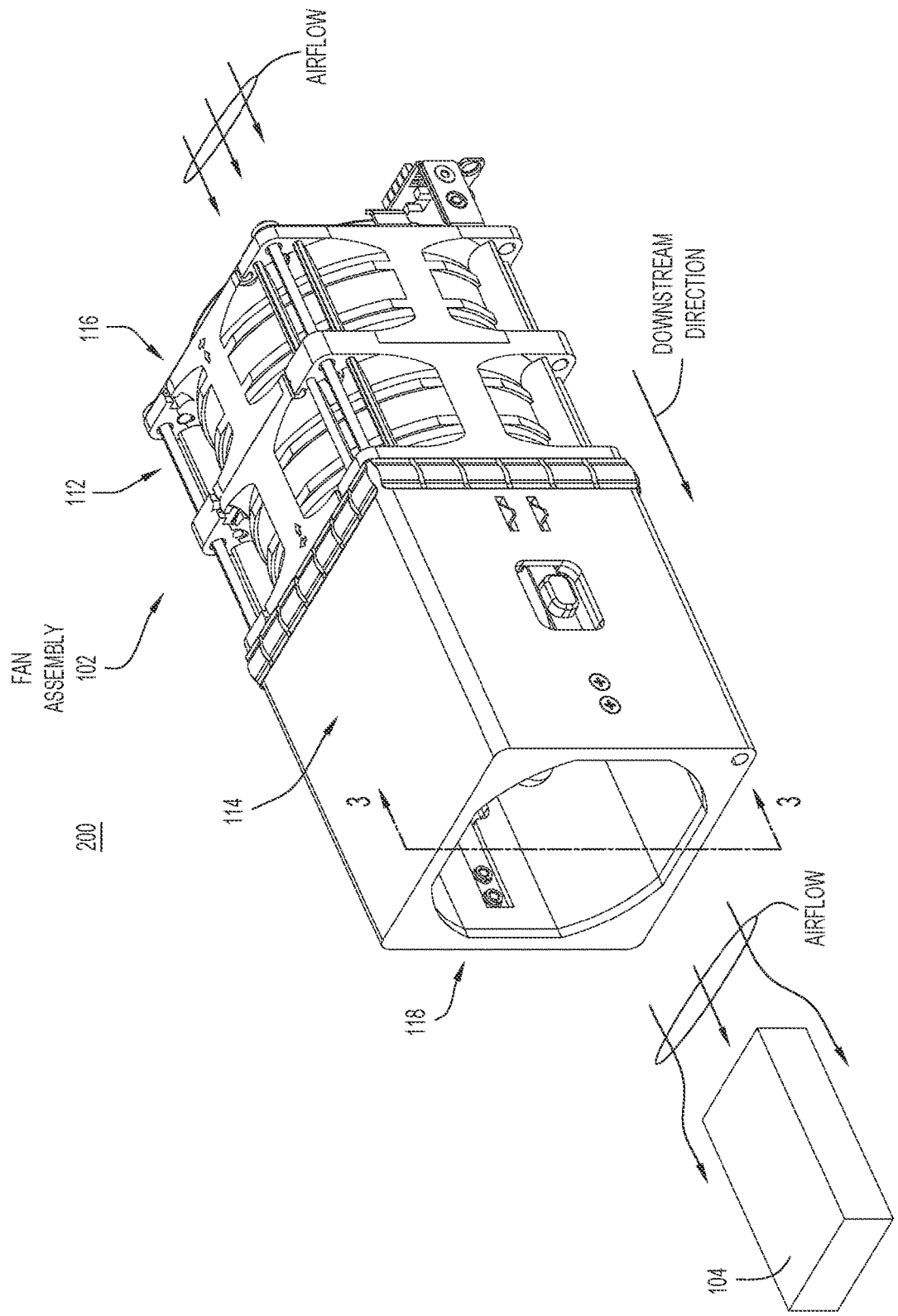
FIG. 2 is a high-level block diagram of a second fan cooling arrangement in which the fan assembly cools the heat source positioned downstream from the fan assembly, according to an example embodiment.

With reference to FIG. 2, there is a high-level block diagram of an example second fan cooling arrangement 200 in which fan assembly 102 cools heat source 104 positioned downstream from the fan assembly. That is, in second fan cooling arrangement 200, heat source 104 is positioned adjacent to and downstream from housing outlet 118. When operating, fan assembly 102 continuously draws cool air into the fan assembly via fan intake 116 and vents or exhausts the cool air through housing outlet 118 toward and over heat source 104. The cool air flows over and around heat source 104 to force heat away from, and thereby cool, the heat source.

Figure 3:
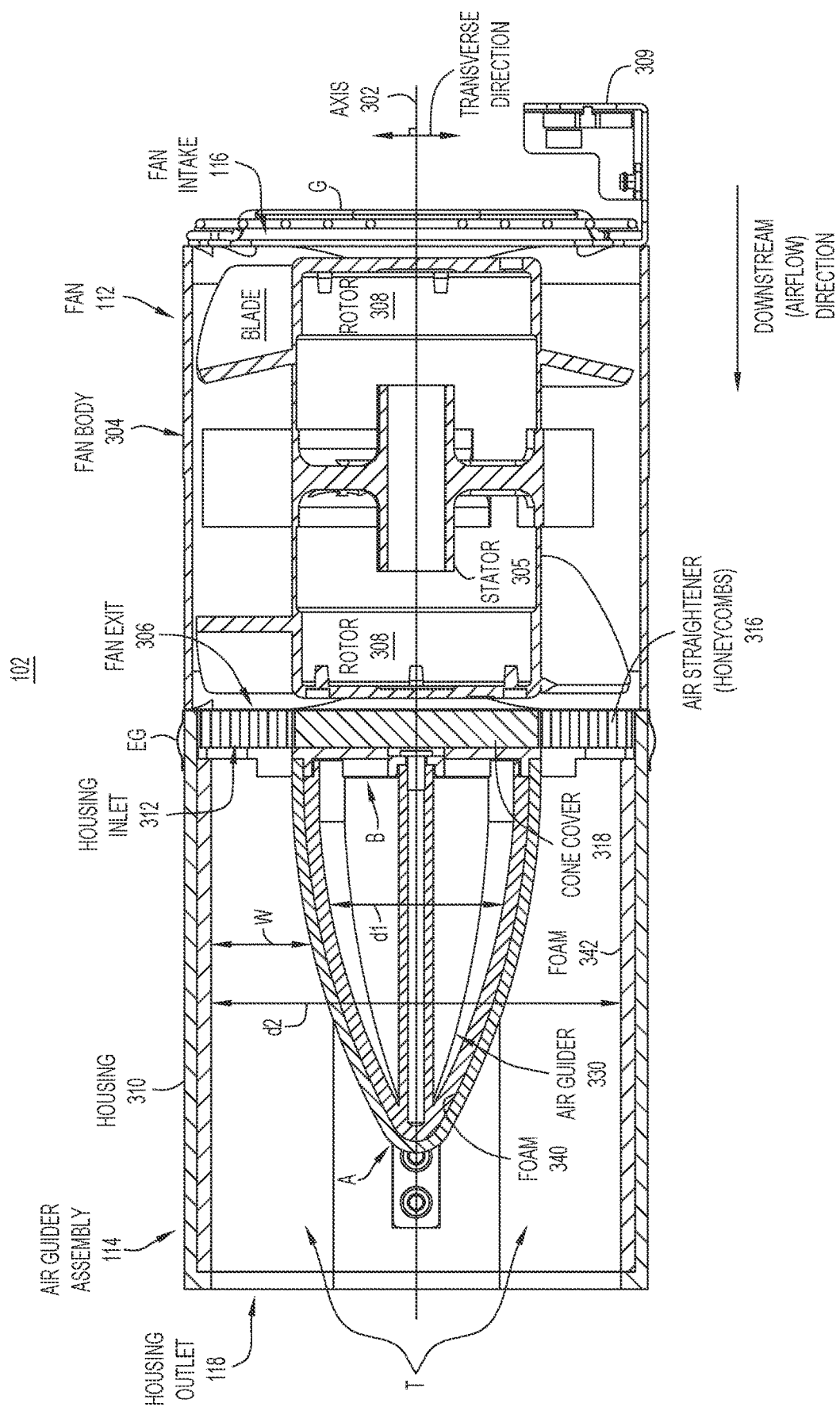
FIG. 3 is a cross-sectional view of the fan assembly, taken along a line 3-3 in FIG. 2, accordance to an example embodiment.
Figure 4:
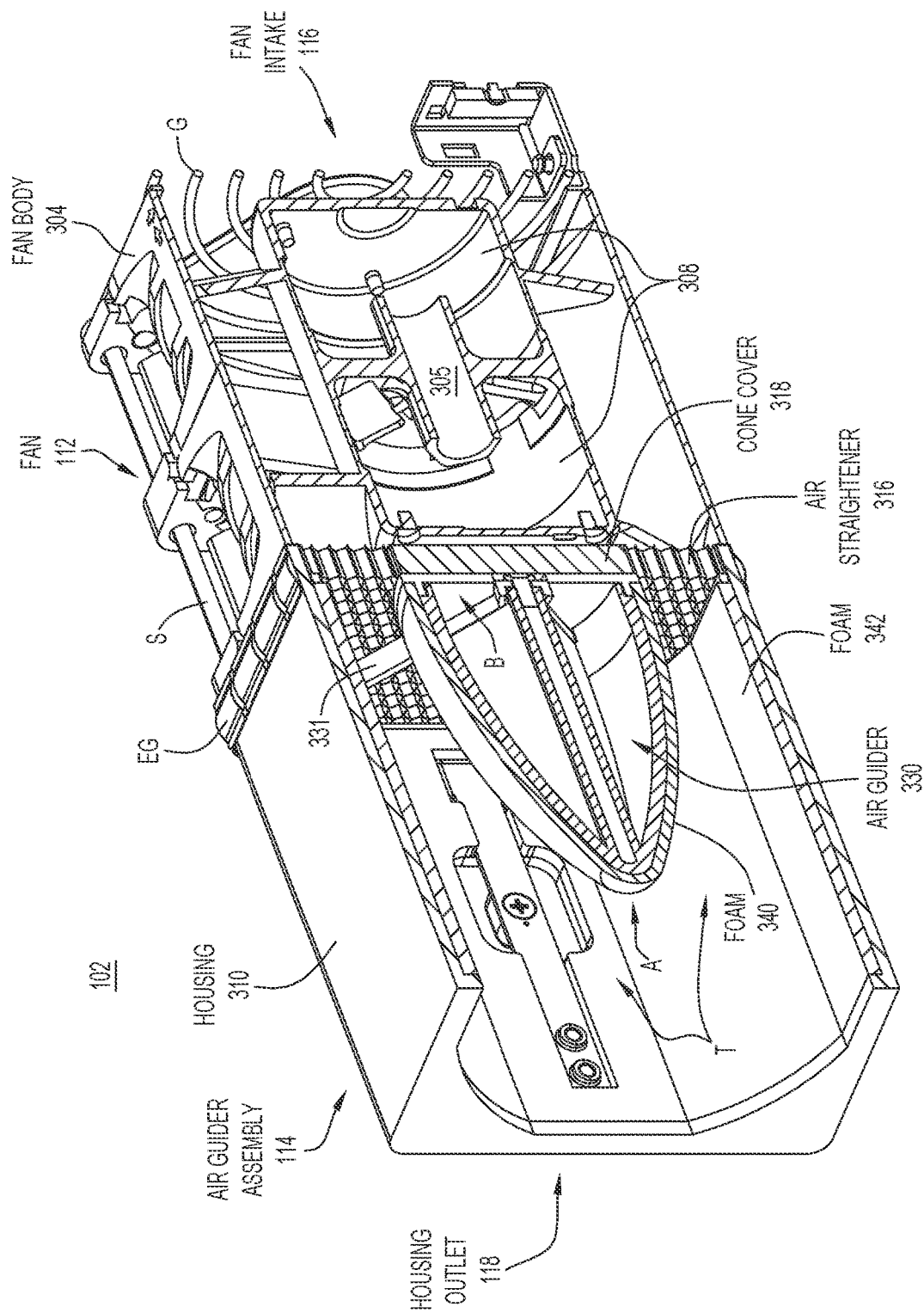
FIG. 4 is a combined cross-sectional and perspective view of the fan assembly looking into a housing outlet of the fan assembly at an angle, according to an example embodiment.
Figure 5:
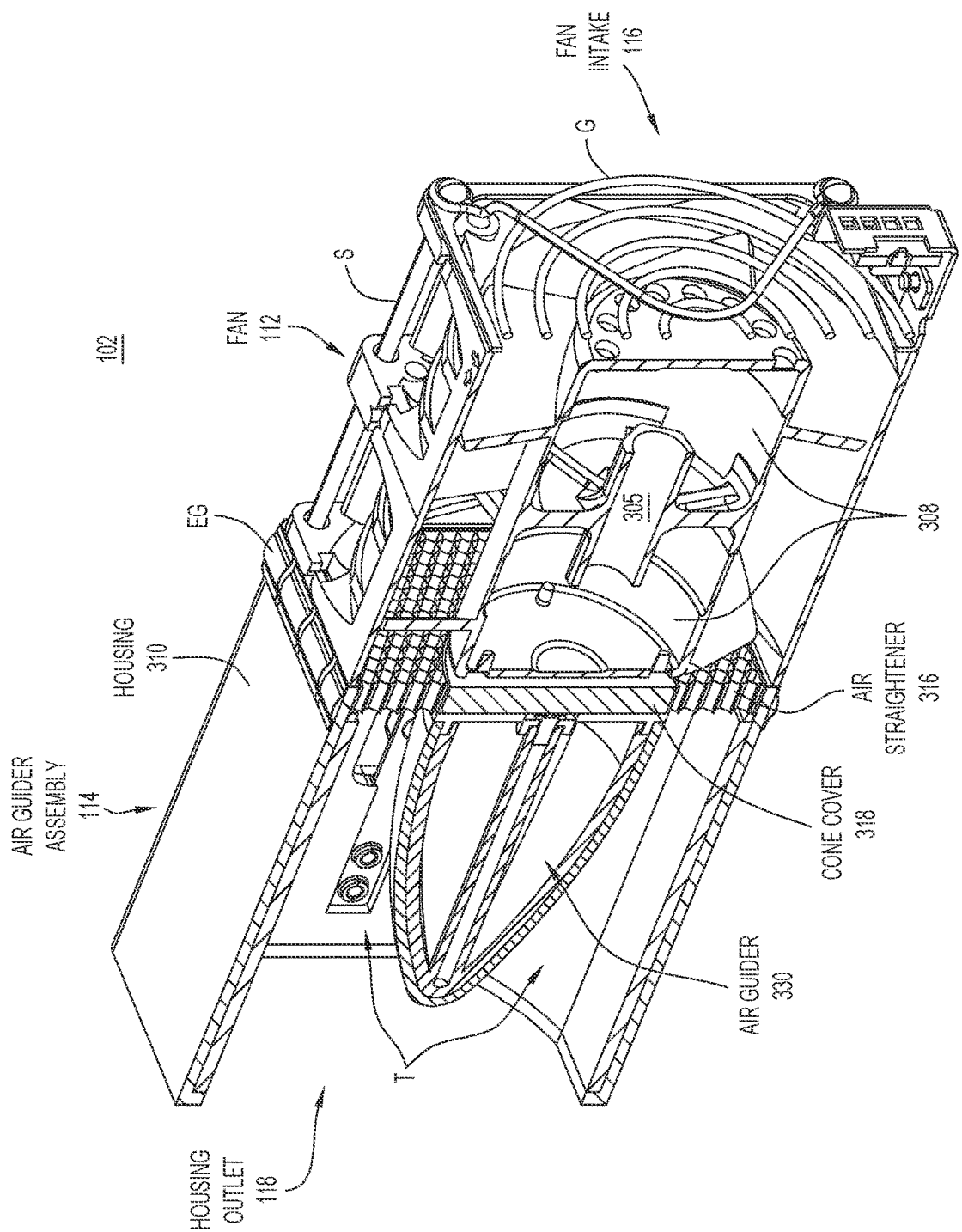
FIG. 5 is a combined cross-sectional and perspective view of the fan assembly looking into a fan intake of the fan assembly at an angle, according to an example embodiment.
Figure 6:
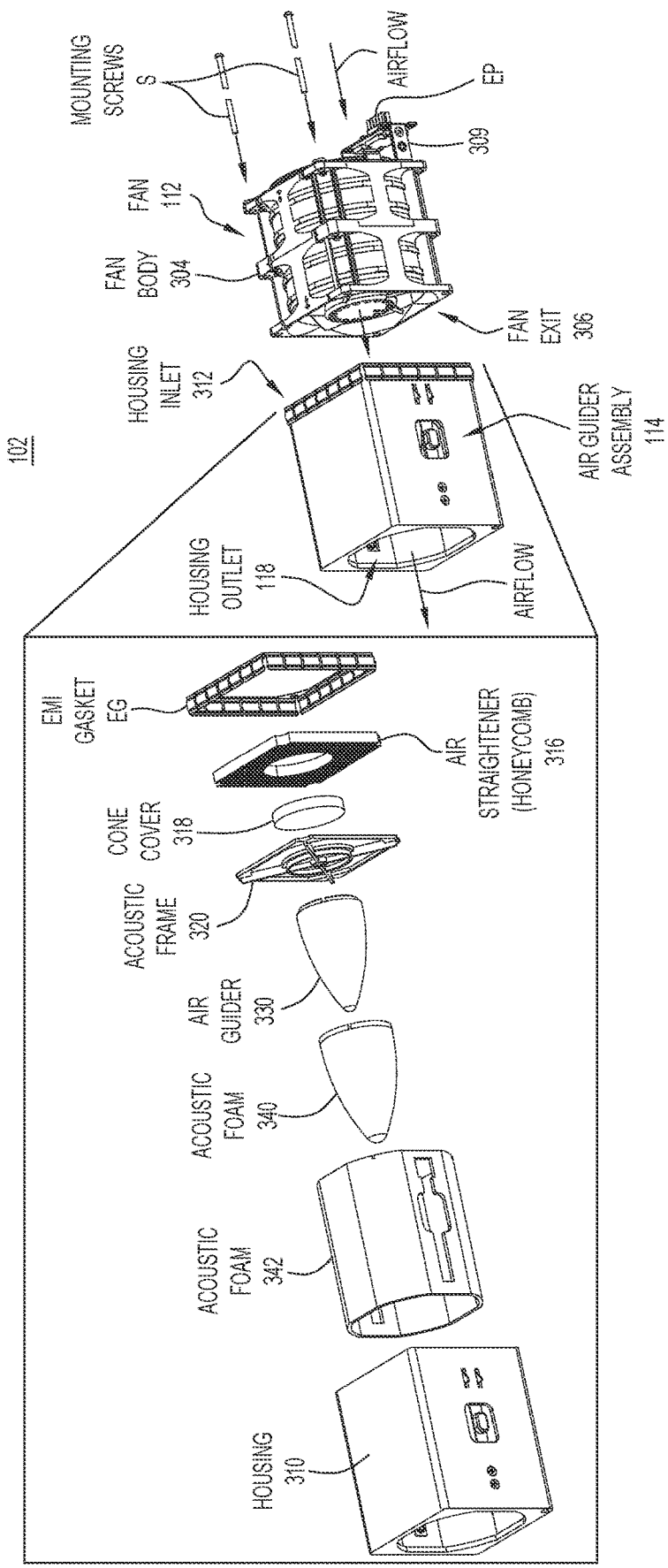
FIG. 6 is a disassembled view of the fan assembly, including an exploded view of an air guider assembly of the fan assembly, according to an example embodiment.

Fan assembly 102 will now be described in detail below with reference primarily to FIGS. 3 and 6, but also with reference to FIGS. 4 and 5. FIG. 3 is a cross-sectional view of fan assembly 102, taken along the line 3-3 in FIG. 2. FIG. 4 is a combined cross-sectional and perspective view of fan assembly 102 looking into housing outlet 118 at an angle. FIG. 5 is a combined cross-sectional and perspective view of fan assembly 102 looking into fan intake 116 at an angle. FIG. 6 is a disassembled view of fan assembly 102 and includes an exploded view of air guider assembly 114.

With reference to FIG. 3, fan 112 and air guider assembly 114 are arranged along, and centered on, a center axis 302 (referred to simply as "axis 302") of fan assembly 102. Fan 112 and air guider assembly 114 may be releasably mounted/fixed to each other using removable screws S (best seen in FIGS. 4, 5, and 6), such that, once mounted to each other, the air guider assembly and the fan can be separated from each other easily without damaging either of the components. The example shown in the figures uses screws S to attach fan 112 to air guider assembly 114; however, any known mechanism that permits such removable mounting of the fan to the air guider assembly may be employed. Thus, fan assembly 102 has a modular design in which fan 112 and air guider assembly 114 are constructed as individual (separable) modules that are configured to be combined/removably coupled together to form the fan assembly.

In the example shown in the figures, fan 112 is an axial fan having a fan body 304 that is substantially cylindrical. Fan body 304 is centered on and extends along axis 302. Fan body 304 terminates at spaced-apart opposing peripheral edges of the fan body that respectively define fan intake 116 and a fan exit 306 downstream from the fan intake. Fan intake 116 and fan exit 306 respectively include openings having cross-sectional areas that are transverse to (i.e., extend in a transverse direction that is perpendicular to axis 302) and centered on the axis. Fan 112 includes an intake guard G mounted to fan body 304 at fan intake 116. Fan body 304 surrounds a fixed central hub or stator 305 and dual counter-rotating rotors 308 (that each carry fan blades) driven to rotate about axis 302 by a fan motor (not shown). In some examples, fan 112 may be constructed as multiple single axial rotor fans coupled together in series to provide the dual counter-rotating rotors. In other examples, fan 112 may include only a single rotor. More generally, the fan has a least one rotor, but may have multiple rotors. Rotors 308 rotate in a direction to draw air into fan intake 116 and propel the air in the downstream direction to and through fan exit 306, and into air guider assembly 114. Fan assembly 102 also includes a bracket 309 mounted to an edge of fan intake 116 and configured to retain an electrical plug EP (shown in FIG. 6) to receive electrical power to energize fan 112.

Air guider assembly 114 includes an elongated housing 310 that extends parallel to and is centered on axis 302, and that surrounds the axis in contiguous fashion to define an interior volume of the housing. Housing 310 may be shaped such that the interior volume has a cross-sectional area, transverse to and centered on axis 302, with a shape that is any of rectangular, circular, hexagonal, octagonal, and so on. Housing 310 terminates at opposing peripheral edges of the housing (i.e., at right and left spaced-apart ends of the housing in FIG. 3) that respectively define (i) a housing inlet 312 that serves as an air inlet to the housing (from fan exit 306), and (ii) housing outlet 118 downstream from the housing inlet. Housing inlet 312 and housing outlet 118 respectively include openings having cross-sectional areas that are transverse to and centered on axis 302, similar to fan intake 116 and fan exit 306. Housing 310 is configured to be releasably coupled at housing inlet 312 to fan body 304 at fan exit 306, using screws S or other mounting hardware, such as press-fit snaps and the like.

Air guider assembly 114 includes an annular electromagnetic interference (EMI) gasket EG fixed exteriorly to housing 310, around a periphery of housing inlet 312. The components of air guider assembly 114 described next are all positioned within housing 310 (i.e., in the interior volume defined by the housing) and are centered along axis 302. Air guider assembly 114 includes a planar air straightener 316 fixed in housing 310. Air straightener 316 extends across the cross-sectional area of housing inlet 312, except for a circular center cut-out having a diameter that is less than a diameter d2 of housing 310. Air straightener 316 includes an annular array of parallel honeycomb structures (i.e., "honeycombs") that surround the center cut-out. The honeycombs are configured to permit air exiting fan exit 306 and entering housing inlet 312 (in the downstream direction) to flow through the honeycombs in parallel. The honeycombs collectively straighten and streamline the airflow as it passes from fan exit 306 into the interior volume of housing 310. The center cut-out of air straightener 316 is plugged with a substantially planar solid cone cover 318 having the same diameter as the center cut-out. Cone cover 318 blocks air flowing in the downstream direction from entering housing inlet 312 at the cone cover.

Air guider assembly 114 includes a substantially planar acoustic frame 320 (best seen in FIG. 6), fixed in housing 310, adjacent to and downstream from air straightener 316. Acoustic frame 320 extends across the cross-sectional area of the interior volume of housing 310 in the transverse direction and includes a pattern of spaced-apart frame members that permit air to flow in the downstream direction, and that help dampen acoustic noise.

Air guider assembly 114 further includes an air guider 330 (also referred to as an "airflow guider" above) fixed in housing 310 adjacent to and downstream from acoustic frame 320. In an example, air guider assembly 114 includes a radial bracket 331 (shown in FIG. 4) to fix air guider 330 to housing 310. Air guider 330 has a substantially conical shape with a circular base B adjacent to acoustic frame 320 and an apex A opposing/downstream from the base and that points towards housing outlet 118. Base B and apex A of air guider 330 are centered on axis 302. An axial length of air guider 330 extending from base B to apex A is less than an axial length of housing 310 from housing inlet 312 to housing outlet 118, such that apex A of the air guider stops short of (i.e., does not extend beyond) the housing outlet. Base B may be considered as a solid base that blocks airflow, either through operation of cone cover 318, or because the base itself is constructed as a solid base. In an alternative arrangement that obviates the need for radial bracket 331, base B of air guider 330 may be fixed directly to acoustic frame 320 or (fan) stator 305.

Air guider 330 has a diameter d1 (i.e., a transverse/cross-section diameter) that gradually tapers (i.e., is tapered) from a maximum value at base B to a minimum value at apex A. This establishes a conical surface of air guider 330 that tapers from base B to apex A. In a first example, diameter d1 decreases linearly moving from base B to apex A. In a second example, diameter d1 decreases from base B to apex A such that air guider 330 is shaped as a parabola. In a third example, air guider 330 is bullet shaped, as described below in connection with FIG. 7.

In addition, diameter d1 of air guider 330 is less than relatively constant transverse/cross-section diameter d2 of housing 310 moving along a length of the housing that extends from base B to apex A of the air guider, which defines a peripheral volume surrounding the air guider that serves as a tunnel T to convey air flow in the downstream direction. That is, an outer surface of air guider 330 and an inner surface of housing 310 facing the outer surface together form tunnel T between the two facing surfaces. Tunnel T has a transverse annular width W, between the outer surface of air guider 330 and the inner surface of housing 310, that increases in the downstream direction (along the axial length of housing 310) in correspondence with the decrease of diameter d1 of the air guider due to its taper relative to diameter d2. Thus, tunnel T expands or fans-out around air guider 330 in the downstream direction. The shape of air guider 330 (and correspondingly, tunnel T) achieves streamlined laminar flow and reduces turbulence/swirling/vortexes in air propelled in the downstream direction by fan 112, from housing inlet 312 to housing outlet 118 through tunnel T. This increases fan motor efficiency and reduces vibration and noise. Moreover, the reduction in vortexes reduces air flow resistance, which advantageously increases (fan) power savings.

To further dampen acoustic noise, air guider assembly 114 may include an optional conformal layer of noise absorbing acoustic foam 340 that lines or covers the outer surface of air guider 330. Similarly, a conformal layer of acoustic foam 342 may line or cover the inner surface of housing 310 facing the outer surface of air guider 330 and that forms tunnel T. The conformal layers of acoustic foam 340, 342 collectively dampen the acoustic noise arising from the airflow through tunnel T.

The components of fan assembly 102 may be made of metal or plastic, or a combination of metal and plastic, although other materials are possible. In an example, the fan body, rotors, stator, air guider assembly housing, air guider, acoustic frame, cone cover, and air straightener may be injection molded plastic components.

Figure 7:
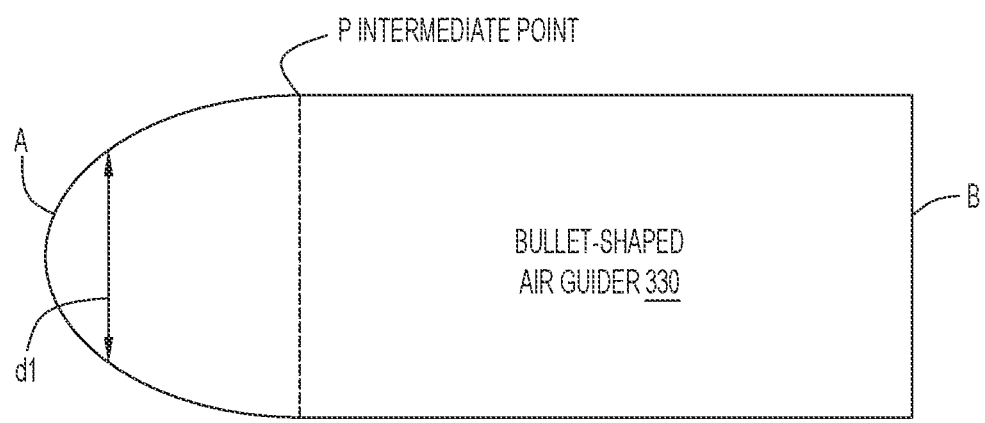
FIG. 7 is a cross-sectional view of a bullet-shaped air guider of the fan assembly, according to an example embodiment.

With reference to FIG. 7, there is a cross-sectional view of an example of air guider 330 that is bullet shaped. In the example of FIG. 7, transverse diameter d1 of air guider 330 is constant from base B to an intermediate point P on air guider 330 that is between the base B and apex A, and then the diameter tapers (i.e., is tapered) from the intermediate point to the apex, to give the air guider its bullet shape.

Figure 8:
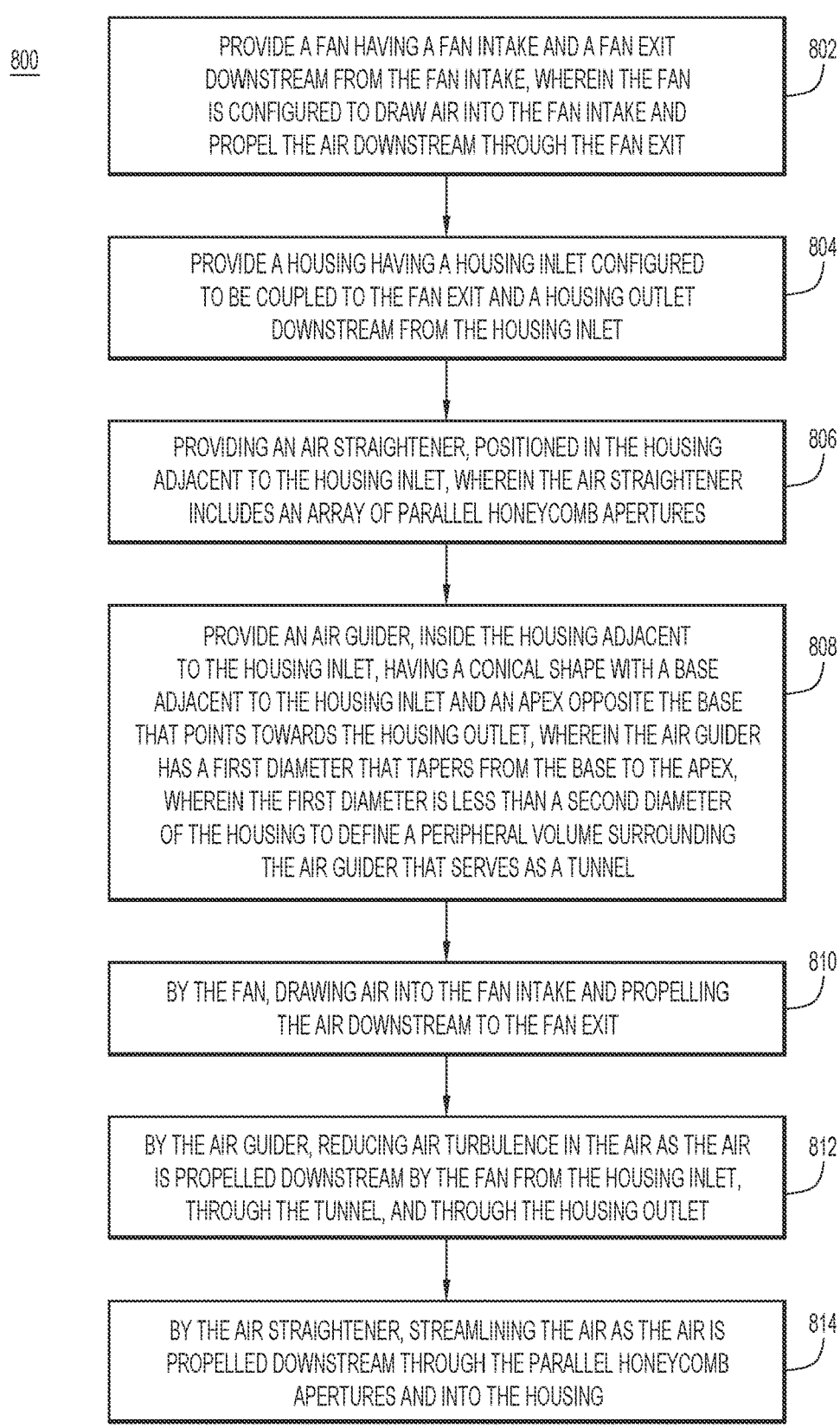
FIG. 8 is a flowchart of a method of reducing turbulent airflow in the fan assembly using an air guider, according to an example embodiment.

With reference to FIG. 8, there is a flowchart of an example method 800 of reducing turbulent airflow in a fan assembly using a conical air guider. The operations/steps of method 800 are described below.

Step 802 includes providing a fan having a fan intake and a fan exit downstream from the fan intake.

Step 804 includes providing a housing coupled to the fan exit, the housing having a housing inlet adjacent to the fan exit and a housing outlet downstream from the housing inlet.

Step 806 (which is optional) includes providing an air straightener, positioned in the housing adjacent to the housing inlet, wherein the air straightener includes an array of parallel honeycomb apertures that provide fluid communication from the fan exit into an interior volume of the housing.

Step 808 includes providing an air guider (i.e., an "airflow guider"), mounted inside the housing adjacent to the housing inlet, having a conical shape with a solid base adjacent to the housing inlet and an apex opposite the base that points towards the housing outlet. The air guider has a first diameter that tapers from the base (or from an intermediate point between the base and the apex) to the apex. The first diameter may decrease monotonically, e.g., linearly or in accordance with a parabola function, along its length from the base to the apex. Alternatively, the first diameter may vary such that the air guider is bullet shaped. The first diameter is less than a second diameter of the housing (which may be relatively constant along a length of the housing extending from the base to the apex of the air guider) to define a peripheral volume surrounding the air guider that expands in the downstream direction and that serves as a tunnel through which air can flow.

Step 810 includes, by the fan, drawing air into the fan intake and propelling the air downstream to the fan exit.

Step 812 includes, by the air straightener, streamlining the air when propelled downstream by the fan through the parallel honeycomb apertures and into the housing. That is, the array of parallel honeycomb apertures of the air straightener collectively permit the air to flow from the fan exit into the tunnel and reduce turbulence in the air while doing so.

Step 814 includes, by the air guider, reducing air turbulence in the air when propelled downstream by the fan from the housing inlet, through the tunnel and around and along the air guider, and through the housing outlet.

In summary embodiments presented herein provide a fan assembly with a cone or bullet-shaped air guider positioned at the fan (exhaust) hub/stator, which avoids inefficient air swirling and improves fan power by 5-10%. The configuration provides higher airflow performance than a conventional fan. This translates to a fan assembly with a higher RPM or cubic feet per minute (CFM). The new fan assembly is a cost-effective solution to save fan power without adjusting fan board circuitry or motor design. The fan assembly operates its fan with an optimum balance of power efficiency, acoustic noise, and airflow performance.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments.

It is also noted that the operations and steps described with reference to the preceding figures illustrate only some of the possible scenarios that may be executed by one or more components/entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the'(s)' nomenclature (e.g., one or more element(s)).

In summary, in some aspects, the techniques described herein relate to a fan assembly including: a fan having a fan intake and a fan exit downstream from the fan intake, wherein the fan is configured to draw air into the fan intake and propel the air downstream through the fan exit; a housing having a housing inlet configured to be coupled to the fan exit and a housing outlet downstream from the housing inlet; and an air guider mounted inside the housing adjacent to the housing inlet, the air guider having a conical shape with a base adjacent to the housing inlet and an apex opposite the base that points towards the housing outlet, wherein the air guider has a first diameter that tapers from the base to the apex, wherein the first diameter is less than a second diameter of the housing to define a peripheral volume surrounding the air guider that serves as a tunnel, and wherein the air guider is configured to reduce air turbulence of the air when propelled from the housing inlet to the housing outlet.

In some aspects, the techniques described herein relate to a fan assembly, further including: first acoustic foam that lines an inner surface of the housing that forms the tunnel; and second acoustic foam that lines an outer surface of the air guider.

In some aspects, the techniques described herein relate to a fan assembly, wherein the fan is an axial fan having at least one rotor.

In some aspects, the techniques described herein relate to a fan assembly, wherein the axial fan includes dual counter-rotating rotors.

In some aspects, the techniques described herein relate to a fan assembly, further including: an array of parallel honeycomb apertures collectively configured to permit the air to flow from the fan exit into the tunnel and to reduce turbulence in the air.

In some aspects, the techniques described herein relate to a fan assembly, wherein: the fan is an axial fan that is centered on a center axis of the fan and the air guider; and the base of the air guider is transverse to and centered on the center axis, the first diameter of the air guider is transverse to the center axis, and the apex of the air guider is centered on the center axis.

In some aspects, the techniques described herein relate to a fan assembly, wherein: the first diameter of the air guider is constant from the base to an intermediate point that is between the base and the apex, and then tapered from the intermediate point to the apex, such that the air guider is bullet shaped.

In some aspects, the techniques described herein relate to a fan assembly, wherein the second diameter of the housing is constant along a length of the housing that extends from the base to the apex of the air guider, such that the tunnel has an annular width that increases along the length.

In some aspects, the techniques described herein relate to a fan assembly, wherein the fan includes a fan body, and wherein the housing is configured to be releasably coupled at the housing inlet to the fan body at the fan exit.

In some aspects, the techniques described herein relate to a fan assembly including: a fan having a fan intake and a fan exit downstream from the fan intake, wherein the fan is configured to draw air into the fan intake and propel the air downstream to the fan exit; a housing configured to be coupled to the fan exit, the housing having a housing inlet adjacent to the fan exit and a housing outlet downstream from the housing inlet; an air straightener positioned in the housing adjacent to the housing inlet, wherein the air straightener includes an array of parallel honeycomb apertures configured to streamline the air when the air is propelled downstream through the parallel honeycomb apertures and into the housing; and an air guider mounted inside the housing downstream from the air straightener, the air guider having a conical shape with a base adjacent to the housing inlet and an apex opposite the base that points towards the housing outlet, wherein the air guider has a first diameter that tapers from the base to the apex, wherein the first diameter is less than a second diameter of the housing to define a peripheral volume surrounding the air guider that serves as a tunnel, and wherein the air guider is configured to reduce air turbulence of the air when the air is propelled downstream by the fan through the housing inlet, the air straightener, the tunnel, and the housing outlet.

In some aspects, the techniques described herein relate to a fan assembly, further including: first acoustic foam that lines an inner surface of the housing that forms the tunnel; and second acoustic foam that lines an outer surface of the air guider.

In some aspects, the techniques described herein relate to a fan assembly, wherein the fan is an axial fan having at least one rotor.

In some aspects, the techniques described herein relate to a fan assembly, wherein the axial fan includes dual counter-rotating rotors.

In some aspects, the techniques described herein relate to a fan assembly, wherein: the fan is an axial fan centered on an axis; the housing is centered on and surrounds the axis; the air straightener is transverse to and centered on the axis; and the base of the air guider is transverse to and centered on the axis, the first diameter of the air guider is transverse to the axis, and the apex of the air guider is centered on the axis.

In some aspects, the techniques described herein relate to a fan assembly, wherein the second diameter of the housing is constant along a length of the housing that extends from the base to the apex of the air guider, such that the tunnel has an annular width that increases along the length.

In some aspects, the techniques described herein relate to a fan assembly, wherein the fan includes a fan body, and wherein the housing is configured to be releasably coupled at the housing inlet to the fan body at the fan exit.

In some aspects, the techniques described herein relate to a method including: providing a fan having a fan intake and a fan exit downstream from the fan intake; providing a housing coupled to the fan exit, the housing having a housing inlet adjacent to the fan exit and a housing outlet downstream from the housing inlet; providing an air guider, mounted inside the housing adjacent to the housing inlet, having a conical shape with a base adjacent to the housing inlet and an apex opposite the base that points towards the housing outlet, wherein the air guider has a first diameter that tapers from the base to the apex, wherein the first diameter is less than a second diameter of the housing to define a peripheral volume surrounding the air guider that serves as a tunnel; by the fan, drawing air into the fan intake and propelling the air downstream to the fan exit; and by the air guider, reducing air turbulence in the air as the air is propelled downstream by the fan from the housing inlet, through the tunnel, and through the housing outlet.

In some aspects, the techniques described herein relate to a method, further including: providing an air straightener, positioned in the housing adjacent to the housing inlet, wherein the air straightener includes an array of parallel honeycomb apertures; and by the air straightener, streamlining the air as the air is propelled downstream through the parallel honeycomb apertures and into the housing.

In some aspects, the techniques described herein relate to a method, wherein: the fan is an axial fan that is centered on a center axis of the fan and the air guider; and the base of the air guider is transverse to and centered on the center axis, the first diameter of the air guider is transverse to the center axis, and the apex of the air guider is centered on the center axis.

In some aspects, the techniques described herein relate to a method, wherein: the first diameter of the air guider is constant from the base to an intermediate point that is between the base and the apex, and then tapered from the intermediate point to the apex.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A fan assembly comprising:
    a fan having a fan intake and a fan exit downstream from the fan intake, wherein the fan is configured to draw air into the fan intake and propel the air downstream through the fan exit;
    a housing having a housing inlet configured to be coupled to the fan exit and a housing outlet downstream from the housing inlet;
    an air straightener, adjacent to the housing inlet, having an annular array of honeycomb apertures that surround a center cut-out and streamline the air that flows downstream, and a solid cover that plugs the center cut-out and blocks the air; and
    an air guider mounted inside the housing adjacent to the housing inlet, the air guider having a conical shape with a base adjacent to the solid cover, and an apex opposite the base that points towards the housing outlet, wherein the air guider has a first diameter that tapers from the base to the apex to define a peripheral volume surrounding the air guider that serves as a tunnel, and wherein the air guider is configured to reduce air turbulence of the air when propelled from the housing inlet to the housing outlet.

2. The fan assembly of claim 1, further comprising:
    first acoustic foam that lines an inner surface of the housing that forms the tunnel; and
    second acoustic foam that lines an outer surface of the air guider.

3. The fan assembly of claim 1, wherein the fan is an axial fan having at least one rotor.

4. The fan assembly of claim 3, wherein the axial fan includes dual counter-rotating rotors.

5. The fan assembly of claim 3, further comprising:
    an acoustic frame, positioned between the air straightener and the air guider, having a pattern of spaced-apart frame members that permit the air to flow downstream while dampening acoustic noise.

6. The fan assembly of claim 1, wherein:
    the fan is an axial fan that is centered on a center axis of the fan and the air guider; and
    the base of the air guider is transverse to and centered on the center axis, the first diameter of the air guider is transverse to the center axis, and the apex of the air guider is centered on the center axis.

7. The fan assembly of claim 1, wherein the first diameter of the air guider is constant from the base to an intermediate point that is between the base and the apex, and then tapered from the intermediate point to the apex, such that the air guider is bullet shaped.

8. The fan assembly of claim 1, wherein a second diameter of the housing is constant along a length of the housing that extends from the base to the apex of the air guider, such that the tunnel has an annular width that increases along the length.

9. The fan assembly of claim 1, wherein the fan includes a fan body, and wherein the housing is configured to be releasably coupled at the housing inlet to the fan body at the fan exit.

10. A fan assembly comprising:
    a fan having a fan intake and a fan exit downstream from the fan intake, wherein the fan is configured to draw air into the fan intake and propel the air downstream to the fan exit;
    a housing configured to be coupled to the fan exit, the housing having a housing inlet adjacent to the fan exit and a housing outlet downstream from the housing inlet;
    an air straightener positioned in the housing adjacent to the housing inlet, wherein the air straightener includes an annular array of parallel honeycomb apertures surrounding a center cut-out and configured to streamline the air when the air is propelled downstream through the annular array of the parallel honeycomb apertures and into the housing, wherein the air straightener further comprises a solid cover that plugs the center cut-out and blocks the air; and
    an air guider mounted inside the housing downstream from the air straightener, the air guider having a conical shape with a base adjacent to the solid cover and an apex opposite the base that points towards the housing outlet, wherein the air guider has a first diameter that tapers from the base to the apex, to define a peripheral volume surrounding the air guider that serves as a tunnel, and wherein the air guider is configured to reduce air turbulence of the air when the air is propelled downstream by the fan through the housing inlet, the air straightener, the tunnel, and the housing outlet.

11. The fan assembly of claim 10, further comprising:
first acoustic foam that lines an inner surface of the housing that forms the tunnel; and
second acoustic foam that lines an outer surface of the air guider.

12. The fan assembly of claim 10, wherein the fan is an axial fan having at least one rotor.

13. The fan assembly of claim 12, wherein the axial fan includes dual counter- rotating rotors.

14. The fan assembly of claim 10, wherein:
the fan is an axial fan centered on an axis;
the housing is centered on and surrounds the axis;
the air straightener is transverse to and centered on the axis; and
the base of the air guider is transverse to and centered on the axis, the first diameter of the air guider is transverse to the axis, and the apex of the air guider is centered on the axis.

15. The fan assembly of claim 10, wherein a second diameter of the housing is constant along a length of the housing that extends from the base to the apex of the air guider, such that the tunnel has an annular width that increases along the length.

16. The fan assembly of claim 10, wherein the fan includes a fan body, and the housing is configured to be releasably coupled at the housing inlet to the fan body at the fan exit.

17. A method comprising:
providing a fan having a fan intake and a fan exit downstream from the fan intake;
providing a housing coupled to the fan exit, the housing having a housing inlet adjacent to the fan exit and a housing outlet downstream from the housing inlet;
providing an air straightener, adjacent to the housing inlet, having an annular array of honeycomb apertures that surround a center cut-out, and a solid cover that plugs the center cut- out;
providing an air guider, mounted inside the housing adjacent to the housing inlet, having a conical shape with a base adjacent to the solid cover, and an apex opposite the base that points towards the housing outlet, wherein the air guider has a first diameter that tapers from the base to the apex, to define a peripheral volume surrounding the air guider that serves as a tunnel;
by the fan, drawing air into the fan intake and propelling the air downstream to the fan exit;
by the air straightener, streamlining the air that flows downstream; and
by the air guider, reducing air turbulence in the air as the air is propelled downstream by the fan from the housing inlet, through the tunnel, and through the housing outlet.

18. The method of claim 17, further comprising:
providing an acoustic frame, positioned between the air straightener and the air guider, having a pattern of spaced-apart frame members that permit the air to flow downstream while dampening acoustic noise.

19. The method of claim 17, wherein:
the fan is an axial fan that is centered on a center axis of the fan and the air guider; and
the base of the air guider is transverse to and centered on the center axis, the first diameter of the air guider is transverse to the center axis, and the apex of the air guider is centered on the center axis.

20. The method of claim 17, wherein the first diameter of the air guider is constant from the base to an intermediate point that is between the base and the apex, and then tapered from the intermediate point to the apex.

* * * * *